US006696700B2

(12) United States Patent
Gong et al.

(10) Patent No.: US 6,696,700 B2
(45) Date of Patent: Feb. 24, 2004

(54) P-TYPE TRANSPARENT COPPER-ALUMINUM-OXIDE SEMICONDUCTOR

(75) Inventors: Hao Gong, Singapore (SG); Yue Wang, Singapore (SG); Lei Huang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/095,163

(22) Filed: Mar. 8, 2002

(65) Prior Publication Data

US 2003/0057495 A1 Mar. 27, 2003

Related U.S. Application Data

(60) Provisional application No. 60/274,495, filed on Mar. 9, 2001.

(51) Int. Cl.$^7$ ............................................. H01L 29/12
(52) U.S. Cl. ............................ 257/43; 257/40; 438/85; 438/86
(58) Field of Search ................... 257/40–43; 428/697; 438/609, 681, 85–86, 104, 754

(56) References Cited

U.S. PATENT DOCUMENTS

| | | | | |
|---|---|---|---|---|
| 4,130,426 A | * | 12/1978 | Takeda et al. | 430/151 |
| 4,184,874 A | * | 1/1980 | Takeda | 430/236 |
| 4,226,790 A | * | 10/1980 | Walker | 556/1 |
| 4,540,546 A | * | 9/1985 | Giessen | 420/590 |
| 4,560,780 A | * | 12/1985 | Siedle | 556/40 |
| 4,752,333 A | * | 6/1988 | Caisso et al. | 75/232 |
| 5,407,710 A | * | 4/1995 | Baum et al. | 427/555 |
| 5,852,088 A | * | 12/1998 | Dismukes et al. | 524/175 |
| 6,294,274 B1 | * | 9/2001 | Kawazoe et al. | 428/697 |
| 2001/0041250 A1 | * | 11/2001 | Werkhoven et al. | 428/212 |

FOREIGN PATENT DOCUMENTS

| | | | | |
|---|---|---|---|---|
| EP | 1240941 | * | 3/1997 | ............ B01J/23/72 |
| JP | 03-047966 | * | 2/1991 | ......... H01L/21/285 |
| JP | 405074653 | * | 3/1993 | ............ H01G/4/12 |
| JP | 06326104 | * | 10/1994 | ....... H01L/21/3205 |

OTHER PUBLICATIONS

Kawazoe, et al., Transparent p–type Conducting Oxides: : Design and Fabrication of p–n Heterojunctions, Aug. 2000, MRS Bulletin, pp. 28–36.*

H. Kawazoe, M. Yasukawa, H. Hyodo, M. Kurita, H. Yanagi. H. Hosono, P–type electrical conduction in transparent thin films of CuAlO$_2$, Nature, vol 389, 1997, pp939–942.

A. Kudo, H. Yanagi, H.Hosono, H. Kawazoe, SrCu$_2$O$_2$ : A p–type conductive oxide with wide band gap, Applied Physics Letters, vol. 73, 1998. pp 220–222.

T. Minami. K. Shimokawa, T. Miyata, P–type transparent conducting In$_2$O$_3$–Ag$_2$O thin films prepared by rf magnetron sputtering, J. Vac. Sci. Technol., vol A16(3), 1998, pp1218–1221.

K. Minegishi, Y. Koiwai, Y. Kikuchi, K. Yano, M. Kasuga, A. Shimizu, Growth of p–type Oxide Films by Chemical Vapor Deposition, Jpn, J. Appl. Phys., vol 36, 1997, pp1453–1455.

(List continued on next page.)

*Primary Examiner*—Wael Fahmy
*Assistant Examiner*—Thao X. Le
(74) *Attorney, Agent, or Firm*—Klarquist Sparkman, LLP

(57) ABSTRACT

This invention provides a transparent Cu—Al—O semiconducting film having a p-type conductivity greater than $0.95 \times 10^{-1}$ S·cm$^{-1}$. This invention also relates to a process for preparing a Cu—Al—O film having p-type conductivity, comprising: a) controllably vaporizing organo-copper and organo-aluminum precursors and carrying the vapors into a chemical vapor deposition chamber with an inert gas flow; b)reacting and depositing the vapors on a substrate, preferably a light-transmitting substrate, through a chemical vapor deposition process.

21 Claims, 8 Drawing Sheets

OTHER PUBLICATIONS

Figure 1:
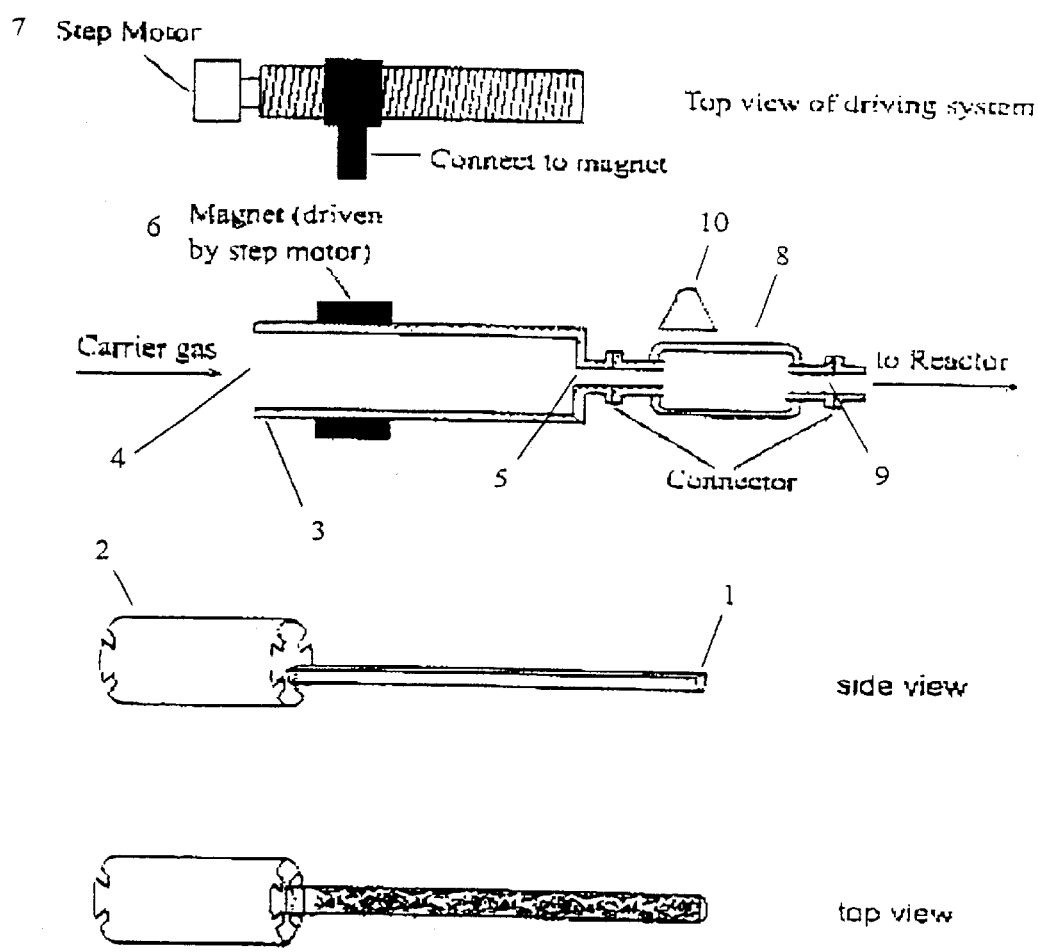

H. Katayama–Yoshida, T. Nishimatsu, T. Yamamoto, N. Orita, Comparison between the Theoretical Prediction of Codoping and the Recent Experimental Evidences of p–Type GaN, AIM, AnSc, CuInS$_2$ and p–Type Diamond, Phys. Stat. Sol., vol (13)210, 1998, pp 429–436.

O. Porat, I. Riess, Defect chemistry of Cu$_2$O at elevated temperatures. Part II: Electrical conductivity, thermoelectric power and charged point defects, Solid State Ionics, vol 81, 1995, pp 29–41.

R.T. Collins, P.M. Fauchet, M.A. Tischler, Porous silican; From Luminescence to LEDs, Physics Today, vol 50, 1997, pp 24–31.

J.R. Heath, The Chemistry of Size and Order on the Nanometer Scale, Science, vol 270. 1995, pp1315–1316.

A.E. Rakhshani, Thermostimulated impurity conduction in characterization of electrodeposited Su$_2$O films, J. Appl. Phys., vol 69(4), 1991, pp 2290–2295.

A.P. Alivisatos, Semiconductor Clusters, Nanocrystals, and Quantom Dots, Science, vol 271, 1996, pp933–937.

Z.H. Lu, D.J. Lockwood, J.–M. Baribeau, Quantum confinement and light emission in SiO$_2$/Si superlattccs, Nature, vol 378, 1995, pp258–260.

T. Yamamoto, H. Katayama–Yoshida, A Codoping Method in CuInS$_2$ Proposed by *ab inirio* Electronic Structure Calculations, Inst. Phys. Conf Ser. No 152, 1998, pp 37–40.

R. Epicier, C. Esnouf, HREM study of the chemical nature of twin planes in CuAlO$_2$, Philosophical Magazine Letters, vol 61, 1990, pp285–291.

* cited by examiner

P-TYPE TRANSPARENT COPPER-ALUMINUM-OXIDE SEMICONDUCTOR

The application claims the benefit of U.S. Provisional Application No. 60/274,495, which was filed on Mar. 9, 2001.

This invention relates to p-type transparent thin film oxides.

Transparent semiconductors are special because they allow visible light to pass through but absorb ultraviolet (UV) radiation. Although n-type transparent semiconductors such as ZnO, $SnO_2$, ITO (indium tin oxide) have been well developed, unfortunately very few p-type transparent semiconductors have been reported, and their conductivity is far below that of the n-type semiconductors. N-type transparent semiconductors can have a conductivity of $10^3$ S·cm$^{-1}$ while also benefiting from transmittance values of up to 80%. This unbalanced development is a barrier to the success of transparent p-n junctions or devices, which makes significant applications impossible.

P-type transparent semiconductors are difficult to create due to strong localization of the upper edge of the valence band to oxide ions. Up to now, only very limited p-type transparent conducting oxide (TCO) thin films have been fabricated. Most of these films show either low conductivity or low transmittance. ZnO doped with nitrogen has a low conductivity of $10^{-2}$ S·cm$^{-1}$ and has a brown color that permits poor light-transmittance. Another p-type oxide is $In_2O_3$—$Ag_2O$, which has a conductivity of $10^3$ S·cm$^{-1}$ with a low average transmittance of 20% in the visible range.

The most successful p-type TCO was reported by Kawazoe et al. (Nature 389, 939, 1997) to be a $CuAlO_2$ thin film with a conductivity of $0.95 \times 10^{-1}$ S·cm$^{-1}$ and a transmittance ranging from 27% to 52% in the visible light range. This film, $CuAlO_2$ of delafossite structure, was prepared from a bulk $CuAlO_2$ target by the laser ablation technique. Unfortunately, laser ablation is not a method employed by industry. Such a technique is successful in research, but not suitable for industrial mass production due to the small deposition area of the film on the substrate.

SUMMARY OF THE INVENTION

This invention provides a transparent Cu—Al—O semiconducting film having a p-type conductivity greater than $0.95 \times 10^{-1}$ S·cm$^{-1}$.

This invention also relates to a process for preparing a Cu—Al—O film having p-type conductivity, comprising:

a) carrying vapors of organo-copper and organo-aluminum precursors into a CVD chamber with an inert gas flow;

b) reacting and depositing the vapors on a substrate, preferably a light-transmitting substrate, through a chemical vapor deposition process.

Transparent semiconductors are special because they allow visible light to pass through but absorb ultraviolet (UV) radiation. Transparent p-n junctions may permit novel devices such as functional windows and ultraviolet-light emitting diodes.

DETAILED DESCRIPTION OF THE INVENTION

According to one aspect of the invention, there is a p-type transparent semiconductor formed on a substrate, the semiconductor comprising copper, aluminum, and oxygen, preferably fabricated by chemical vapor deposition of organo-copper and organo-aluminum precursors. In one preferred embodiment the organo-copper and organo-aluminum precursors are used in equimolar amounts.

Chemical Vapor Deposition (CVD) systems, including Metal Organic Chemical Vapor Deposition (MOCVD) systems, can be used for the film deposition of compounds upon the substrate. Through the variation of process parameters, the film obtained can be nano-structured, amorphous, polycrystalline or single crystalline, of which nano-structured is preferred. The MOCVD growth mechanism proceeds by the decomposition of organometallic precursors, such as organo-copper and organo-aluminum, with reactive gases, such as oxygen, at a heated surface of the substrate, such as quartz, on which they are to be deposited. The substrate surface is preferably heated. Good results have been achieved with substrate temperatures of 745 and 830° C. The gas distribution unit can include a plasma-generating electrode system for providing plasma-enhanced deposition. The metals deposit on the surface of the substrate, forming the desired compound and the undesired by-products are pumped away in a gaseous form. The film was successfully deposited at a rate of 2 nm/minute.

According to one aspect of the invention, the precursors are copper and aluminum salts comprising ligands of formula I:

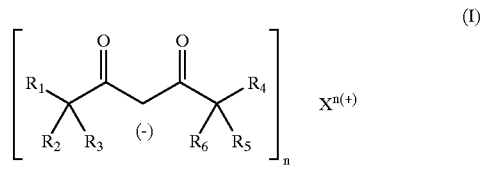

where X is Cu or Al and n is 2 when X is Cu and 3 when X is Al, where $R_1$, $R_2$, $R_3$, $R_4$, $R_5$ and $R_6$ are independently selected from hydrogen, $CH_3$, and fluorine. Preferred ligands include acetylacetonate (acac) where $R_1$–$R_6$ each represent hydrogen, dipivaloylmethanate (dpm) where $R_1$–$R_6$ each represent $CH_3$, trifluoroacetylacetonate (tfa) where $R_1$–$R_3$ each represent fluorine and $R_4$–$R_6$ each represent hydrogen, pivaloyltrifluoroacetonate (pta) where $R_1$–$R_3$ represent fluorine and $R_4$–$R_6$ represent $CH_3$, and hexafluoroacetylacetonate (hfa) where $R_1$–$R_6$ each represent fluorine. Of these, acac and dpm are particularly preferred.

In another aspect, this invention relates to a process for preparing a p-type transparent semiconductor comprising copper, aluminum, and oxygen, comprising:

a) carrying vapors of organo-copper and organo-aluminum precursors into a CVD chamber with an inert gas flow;

b) reacting and depositing the vapors on a substrate, preferably a light transmitting substrate, through a chemical vapor deposition process.

The deposition is preferably carried out in a Plasma Enhanced Metal Organic Chemical Vapor Deposition (PE-MOCVD) apparatus. Oxygen is also supplied as reactive gas.

In one embodiment of this invention, the p-type transparent semiconductor film is further annealed in air, after the deposition. Annealing the semiconductor material leads to an increase in the conductivity, and to an increase in the transmittance of visible light of the material.

The morphology and the thickness of a fabricated p-type transparent semiconductor material can be examined using a field-emission scanning electron microscope, for example with a Phillips XL30 FEG-SEM. The estimated thickness values can be verified with the help of a stylus apparatus, such as an Alpha-step 500 surface profiler. The thickness of the semiconductor fabricated according to this invention can be controlled to be such as 100 nm or 250 nm.

The chemical composition of a film can be determined by energy dispersive X-ray spectroscopy (EDX) calibrated using samples of known composition. It is possible that the ratio of Cu to Al in the semiconductor will be different from the original ratio of Cu to Al present in the precursors, due to the differences in the vaporization speed of the organo-copper and the organo-aluminum precursors, and the differences in the deposition rates of the relevant species. A copper to aluminum molar ratio of 1:1 would be required for a pure $CuAlO_2$ material. The molar ratio of copper to aluminum in the transparent semiconductor of the invention is preferably lower than 1.3:1, more preferably lower than 1.2:1, and particularly preferably 1:1.

Transmission electron microscopy (TEM) can be used to determine the nature of copper found in a transparent semiconductor, TEM analysis of a semiconducting film produces an image and a diffraction pattern that contains a plurality of rings. These rings can be used to deduce lattice spacing values, which can then be matched with corresponding values for known copper aluminum oxides and copper oxides (see Table III, below), From the list of possible copper containing compounds obtained, a further restriction of possible compounds can be achieved by comparing the low-index planes of the copper aluminum oxides and copper oxides with the rings of the diffraction pattern.

In addition to the identification of phases, the TEM image can give information on the size of the crystallites in the semiconductor. In one embodiment of the invention, the crystallites were found to be below 10 nm. Such nanoscale particles and the small sample thickness result in X-ray powder diffraction (technique used to determine crystal composition) signals which are too weak for analysis.

Other analysis techniques such as XFS and Auger techniques can theoretically be used to confirm the presence of monovalent copper as a major component in a semiconductive material, but due to the resolution limit and the lack of accurately known binding energies for $Cu^+$ in $CuAlO_2$, the ratio of $Cu_2O$ to $CuAlO_2$ can not be determined with these techniques.

The type of conductivity available to a semiconductor can be determined by employing the Hall-effect method (BIO-RAD HL5500PC) and the Seebeck technique. When the Seebeck voltages at the cold end of the semiconductors fabricated are positive, a p-type conductivity is indicated. The Hall effect measurement also lead to the same conclusion, based on the positive sign of the Hall Coefficients. The conductivity of the semiconductors of the invention is preferably higher than 2 $S·cm^{-1}$, more preferably higher than 7 $S·cm^{-1}$ and particularly preferably higher than 15 $S·cm^{-1}$. The transparent semiconductors of the invention have a conductivity about two-orders higher than that of the $CuAlO_2$ prepared by the laser-ablation technique. The conductivity of the p-type films of Examples 1 and 2 below is only one or two orders lower than that of the best n-type transparent films.

The mobility and carrier concentration can also be measured by the Hall effect method at room temperature. The carrier concentration of the semiconductors of the invention is preferably higher than $2\times10^{19}·cm^{-3}$, more preferably higher than $4.5\times10^{19}·cm^{-3}$, and particularly preferably higher than $10\times10^{19}·cm^{-3}$. The mobility of the transparent semiconductors of Examples 1 and 2, below, are smaller than that observed for the laser ablation prepared $CuAlO_2$ (10.4 $cm^2V^{-1}s^{-1}$). This smaller mobility may be due to the much higher density of grain boundaries in the film, and the quantum-size effect. Electrical transport depends strongly on size mainly because of the large variation in energy required to add or remove charges on a nanocrystal. On the other hand, the carrier concentration is 2 orders higher than $1.3\times10^{17}$ $cm^{-3}$ of the laser-ablation prepared $CuAlO_2$, which may be due to the smaller activation energy, nanoscale effect and the film-growth technique employed.

Activation energies of the positive carriers can be determined from the temperature dependence of the electrical conductivity. This can be used to verify the semiconductive characteristic of the fabricated material. The activation energy of the semiconductor is preferably lower than 120 meV, more preferably lower then 80 meV, and particularly preferably lower than 40 meV. This smaller activation energy for the positive holes may be the main reason for the higher conductivity for the film.

The transmittance and absorbance of semiconductor films can be measured with a UV-Visible spectrophotometer. According to one aspect of the invention, the transmittance of the semiconductor is preferably higher than 30%, more preferably between 30 and 60%, and particularly preferably between 32 and 45% or 32 to 55%.

The p-type semiconducting film of the invention can be used in the fabrication of p-n junctions or devices, Such devices include ultraviolet-emitting diodes or sheet material suitable for transmitting visible light and transforming ultraviolet light into electric power.

FIG. 1 displays a schematic of a system for solid precursor(s) transport, vaporization and vapor introduction into a CVD chamber (reactor).

Figure 2:
Figure 2:

FIG. 2 displays a high-resolution transmission electron microscopic (TEM) image and electron diffraction pattern of the Cu—Al—O film prepared by chemical vapor deposition, with a TEM high tension of 300 kV.

Figure 3:
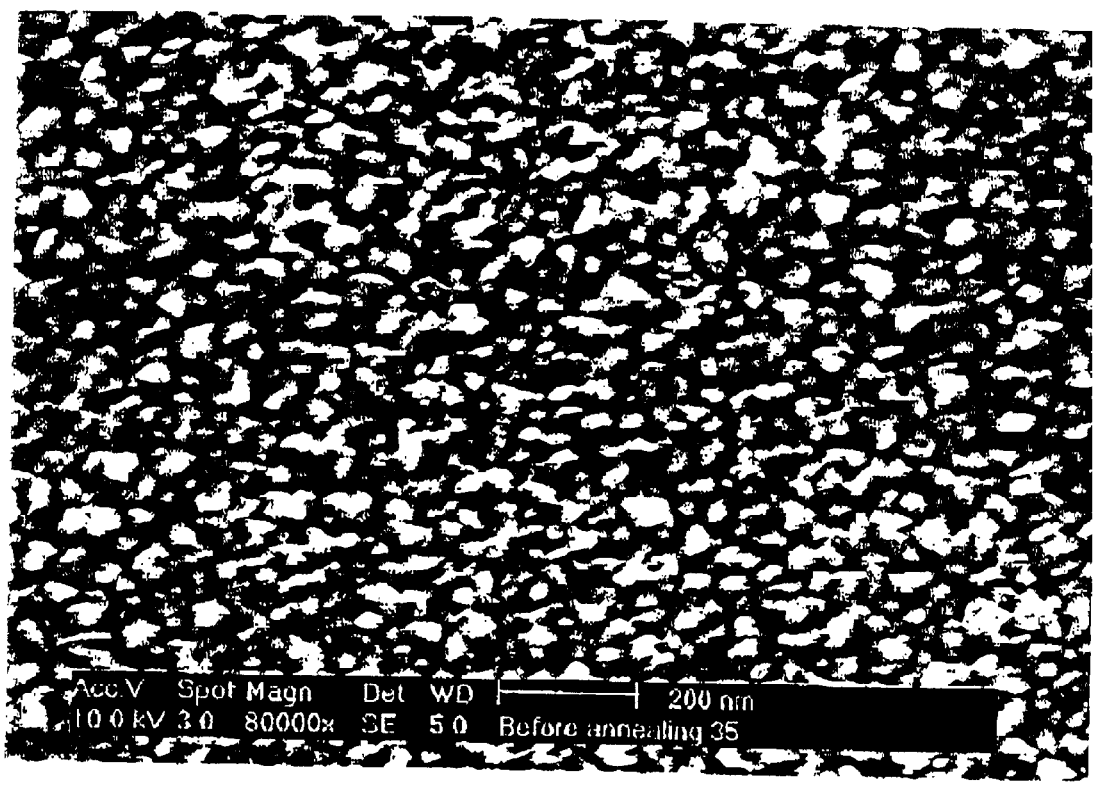

FIG. 3 displays a SEM picture showing the morphology of a CVD fabricated copper aluminum oxide film of Example 2.

Figure 4:
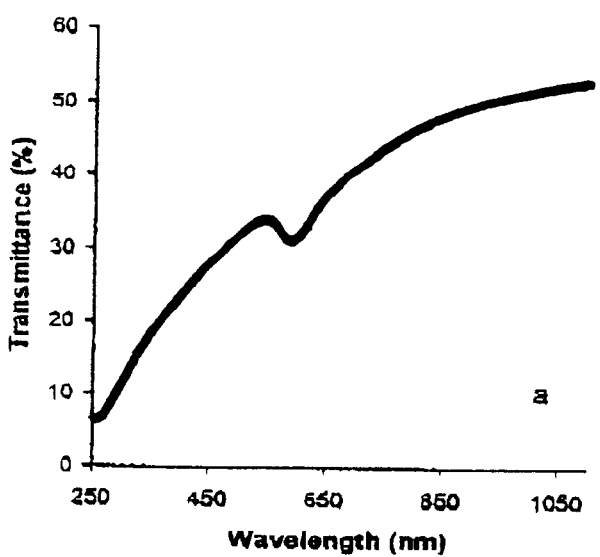

FIG. 4 displays the optical transmission spectrum of a Cu—Al—O film prepared by CVD of $Cu(acac)_2$ and $Al(acac)_3$.

Figure 5:
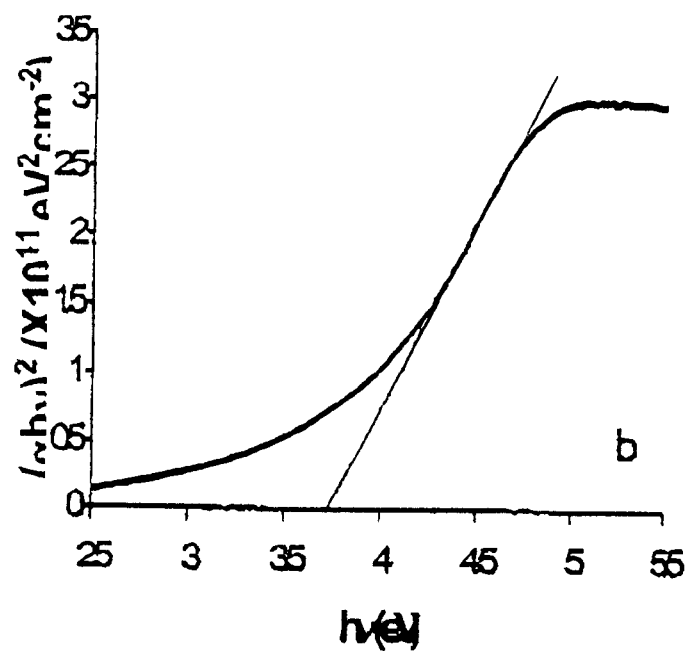

FIG. 5 displays a plot of $(\alpha h v)^2$ against hv for the determination of an optical gap value of a Cu—Al—O film prepared by CVD of $Cu(acac)_2$ and $Al(acac)_3$.

Figure 6:
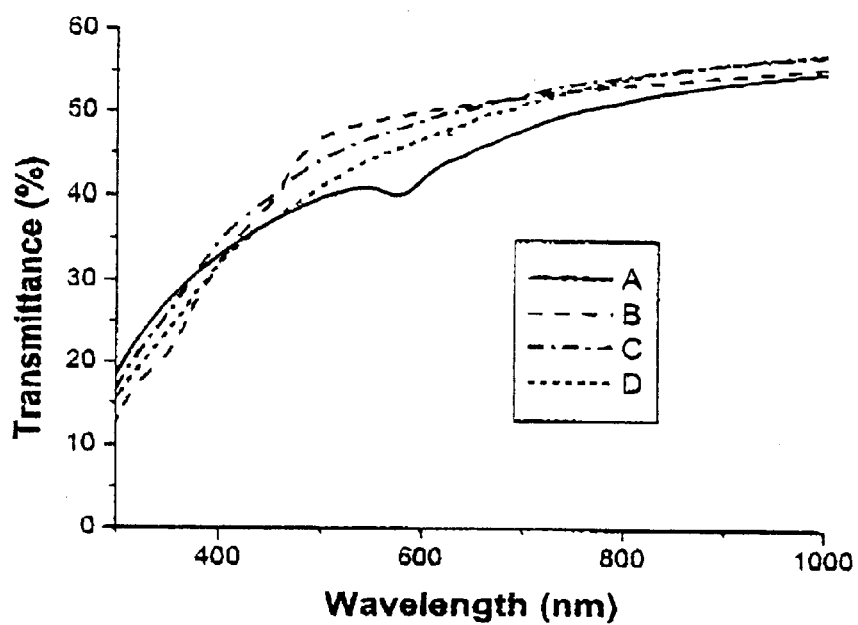

FIG. 6 displays the optical transmission spectrum of a Cu—Al—O film prepared as described in Example 2 below from $Cu(dpm)_2$ and $Al(dpm)_3$, where curve A) represents a non-annealed film, curve B) represents a film after 5 minutes of annealing time, curve C) represents a film after 10 minutes of annealing time, and curve D) represents a film after 15 minutes of annealing time.

Figure 7:
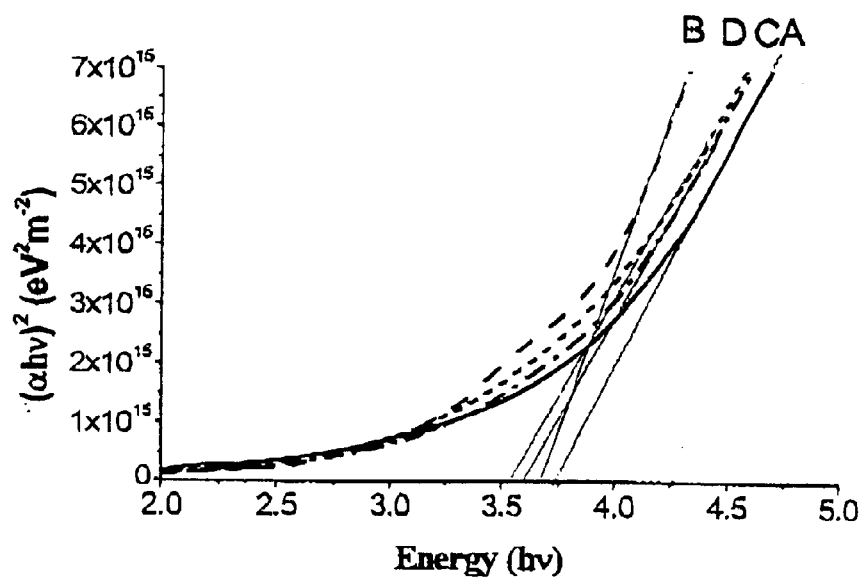

FIG. 7 displays a plot of $(\alpha h v)^2$ against hv for the determination of optical gap spectrum of a Cu—Al—O film prepared by CVD of $Cu(dpm)_2$ and $Al(dpm)_3$, where a) represents a non-annealed film, b) represents a film after 5 minutes of annealing time, c) represents a film after 10 minutes of annealing time, and d) represents a film after 5 minutes of annealing time.

Figure 8:
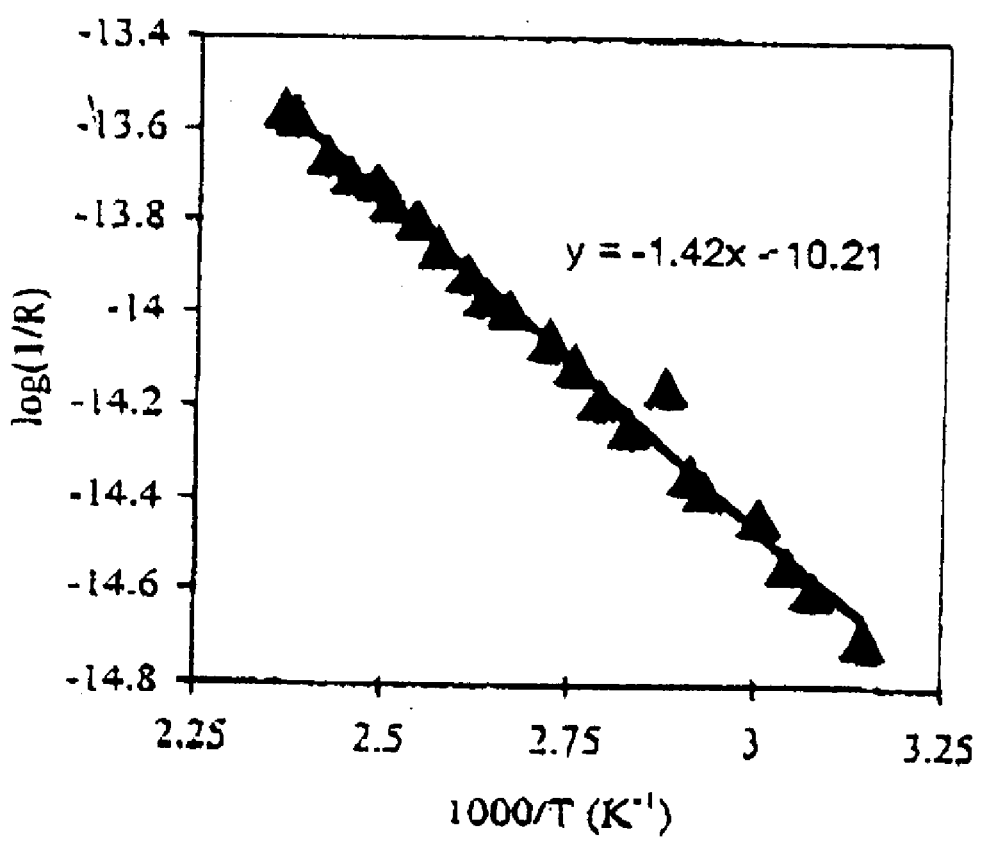

FIG. 8 displays a plot of the electrical conductance as a function of temperature of a Cu—Al—O film prepared by CVD of $Cu(acac)_2$ and $Al(acac)_3$, which is used to determine the activation energy.

FIG. 9 displays a plot of the electrical conductance as a function of temperature of a Cu—Al—O film prepared by CVD of $Cu(dpm)_2$ and $Al(dpm)_3$, which is used to determine the activation energy. Figure a) represents a non-annealed film, b) represents a film after 5 minutes of annealing time, c) represents a film after 10 minutes of annealing time, and d) represents a film after 5 minutes of annealing time.

FIG. 1 shows one example of an apparatus that can be used to vaporize solid precursors such as $Cu(acac)_2$, $Al(acac)_3$, $Cu(dpm)_2$ and $Al(dpm)_3$ for chemical vapor deposition. An elongate open-topped vessel 1 for containing the solid precursor or precursors is connected to a cylinder 2 of a ferromagnetic material, for example iron. The elongate vessel 1 and cylinder 2 are shaped to fit inside a chamber 3 of a non-magnetic material, for example stainless steel. When the cylinder 2 is inside the chamber 3 the vessel 1 projects through a port 5 in an end-face of the chamber 3, and into another chamber 8. An energy source 10 is provided to supply energy to the interior of the chamber 8. In operation, energy from source 10 vaporizes the precursor that is present in the vessel 1, and the vapors are swept by a carrier gas, for example argon, to a reactor in which the deposition occurs. A path for the carrier gas is provided by longitudinally extending channels in the outer surface of the cylinder 2, as shown. To permit controlled supply of precursor to the heated region of chamber 8 there is provided a magnet 6 connected to a threaded rod that can be rotated by means of a step motor 7. As the motor rotates the magnet 6 moves along the threaded rod and the magnetic force also moves the ferromagnetic cylinder 2 and vessel 1, so that the precursor in the vessel 1 is moved in controlled fashion into the heated region where it is vaporized.

Such a system can be used for a single precursor or a mixture of precursors. For transporting a single precursor, two or more such systems (depending on the number of precursors) can be used to introduce precursor vapors from different ports into the reactor for the growth of compound. In one embodiment of the invention, the heat source provides enough energy to heat the precursor material to a temperature of 150° C.

EXAMPLES

Example 1

Organometallic precursors $Cu(acac)_2$ and $Al(acac)_3$ (acac=acetylacetonate) were mixed in a mole ratio of 1:1 and vaporized at about 150° C., using the apparatus of FIG. 1. The vapor was then carried by an argon gas flow into a reaction chamber. Reactive gas, $O_2$, was introduced into the chamber through another inlet. Mass flow controllers were employed to maintain the flow of both the carrier and reactive gases. By using a turbo molecular pump, a reactor base pressure of $3\times10^{-6}$ torr was obtained. Commercial (Asahi Glass Co., Ltd.) quartz substrates of dimension 10 mm×10 mm were employed, which had been cleaned by successive ultrasonic cleaning in analytically pure ethanol, acetone and ethanol before being introduced into the reaction chamber. Prior to the deposition, the substrate was heated at 400° C. for 60 minutes in vacuum of $3\times10^{-6}$ torr for further thermal cleaning and degassing. Cu—Al—O films were prepared in a 13.56 MHz RF plasma enhanced CVD apparatus. The deposition parameters employed are summarized in Table I. The obtained film was characterized through TEM (Table III and FIG. 2), UV-Visible spectrophotometry (FIGS. 4 and 5), and conductance analysis (FIG. 8). The characteristics of the p-type transparent semiconductor obtained are given in Table II. FIG. 2 shows a TEM image and a diffraction ring pattern for the film and lattice spacing values derived from them are listed in Table III. FIG. 4 shows that over the visible light range of 400 nm to 800 nm the transmittance of the film is in the range of approximately 30% to 45%. FIG. 5 displays a plot of $(\alpha h\nu)^2$ as a function of h$\nu$ for the film, from which an optical bandgap value of 3.75 eV is determined. FIG. 8 displays the plot of the electrical conductance as a function of temperature for the film, from which an activation energy value of 120 meV is derived.

The morphology and film thickness were examined using a field-emission scanning electron microscope (Philips XL30 FEG-SEM). An X-ray powder diffraction (XRD) apparatus (Philips X'pert-MPD) and an atomic-resolution transmission electron microscope (Philips CM300 FEG-TEM) were employed to reveal the structure of the sample. The type of conductivity was determined by employing the Hall-effect method (BIO-RAD HL5500PC) and then confirmed with the Seebeck technique. The chemical composition in the film was estimated by energy dispersive x-ray spectroscopy (EDX), calibrated with known samples of different compositions. The transmittance and absorbance of the film were measured by employing the Shimadzu UV-1601 UV-visible spectrophotometer.

The film thickness was estimated to be 250 nm by cross-section scanning electron microscopy and confirmed with a stylus. Transmission electron microscopy (TEM) was also employed. FIG. 2 shows the diffraction pattern and the high-resolution TEM image of the sample. The lattice spacings corresponding to the rings in the diffraction pattern were determined with the camera constant of the equipment and the measurement of the ring radii from the negative. The lattice spacings deduced from the rings were matched with those of various copper aluminum oxides and copper oxides. It was found that the rings could be related to $CuAlO_2$, $Cu_2O$ and $CuAl_2O_4$, and the lattice spacings are listed in Table III. It was noticed that no low-index planes of $CuAl_2O_4$ could match the rings in the diffraction pattern. Therefore, it was deduced that $CuAl_2O_4$ was not present, and only $CuAlO_2$ and $Cu_2O$ existed in the thin film. Measuring the lattice spacing from the atomic-resolution TEM image revealed 0.235±0.005 nm for most grains with a very few exceptions of 0.208±0.005 nm. The former corresponds to $CuAlO_2$ (012) while the latter coincides with $CuAlO_2$ (104) or $Cu_2O$ (200). Other atomic planes with smaller spacings were not observed in the TEM image due to the resolution limit of the equipment. EDX showed that the ratio of Cu to Al was close to the atomic ratio of Cu and Al in $CuAlO_2$, again suggesting that the main component in the film was $CuAlO_2$.

Since these two methods are semi-quantitative analysis tools, other methods to quantify the film composition were tried. XPS and Auger techniques were employed. XPS showed one single $Cu^+$ $2p_{3/2}$ peak. Normally, the $2p_{3/2}$ binding energy of $Cu^+$ is about 932.5 eV to 932.7 eV in different compounds. Due to the resolution limit and the lack of the accurate binding energy of $Cu^+$ in $CuAlO_2$, the ratio of $Cu_2O$ and $CuAlO_2$ could not be determined. Such a ratio was also impossible to determine by the Auger technique due to similar reasons. In addition to the identification of phases, it noticed from the TEM image (see FIG. 3) that the crystallites are below 10 nm. Such nanoscale particles and the small sample thickness may have been the cause for very weak signal in the XRD pattern.

FIG. 4 shows the optical transmittance as a function of wavelength for this CVD-grown film, and FIG. 5 displays a plot of $(\alpha h\nu)^2$ against h$\nu$, where $\alpha$ is the absorption coefficient and h$\nu$ is the photon energy. The optical gap is estimated to be 3.75 eV from FIG. 5, higher than 3.5 eV of $CuAlO_2$ as well as 2.1 eV of $Cu_2O$. To estimate the possible experimental error for this gap value, an exaggeratedly large sample-thickness variation (±20%) was assumed in calculating $\alpha$, and the resulted gap deviation was less than 0.05 eV. This indicated that the optical gap of the film was truly wider. Quantum confinement may be the cause of this wider gap because the exciton confinement in semiconductor nanocrystals leads to the development of discrete, excited electronic states with higher oscillator strength and to band gaps that increase as an inverse function of crystallite size. It is expected that a semiconductor with larger optical gap may lead to a higher transmittance, but the transmittance we obtained appears even slightly smaller than that of the laser-ablation prepared $CuAlO_2$ (optical gap<3.5 eV). This phenomenon may be attributed to a different growth technique, the scattering and absorption of photons by $Cu_2O$ particles in the film and the degradation of the optical properties of the material due to the surface states of semiconductor nanocrystals.

The Hall measurement by van der Pauw configuration revealed a sheet Hall coefficient, mobility and carrier concentration of +2.0 $m^2/C$, 0.5 $cm^2 V^{-1}s^{-1}$ and $2.6 \times 10^{19} cm^{-3}$, respectively. The positive sign of the Hall coefficient indicated a p-type conduction, and this p-type nature was confirmed by the positive voltage at the cold end in the Seebeck measurement. The p-type conductivity of the Cu—Al—O film was found to be 2.0 $S \cdot cm^{-1}$, much higher than $0.95 \times 10^{-1} S \cdot cm^{-1}$ of the laser-ablation prepared $CuAlO_2$ and $\sim 10^{-3} S \cdot cm^{-1}$ of $Cu_2O$. The temperature dependence of electrical conductivity of the film showed typical semiconductor behavior. A straight line was observed in the Arrhenium plot (FIG. 3), and the activation energy was found to be 0.12 eV which was smaller than that 0.2 eV of the laser-ablation prepared $CuAlO_2$. This smaller activation energy for the positive holes may be the main reason of the higher conductivity for the film. The mobility of the film of example 1 is smaller than that (10.4 $cm^2V^{-1}s^{-1}$) of Kawazoe et al. On the other hand, the carrier concentration is 2 orders higher than $1.3 \times 10^{17} cm^{-3}$ of the laser-ablation prepared $CuAlO_2$, which may be due to the smaller activation energy, nanoscale effect and the film-growth technique employed.

Example 2

Cu—Al—O films were prepared in a 13.56 MHz RF plasma enhanced CVD apparatus. The powder of metalorganic precursors $Cu(dpm)_2$ and $Al(dpm)_3$ (dpm=dipivaloylmethanate) of a mole ratio 1:1 were mixed and evaporated at 150° C., using the apparatus of FIG. 1, and the vapor was carried by argon gas into the reaction chamber. $O_2$, the reactive gas, was introduced into the chamber through another inlet. Mass flow controllers controlled the flows of both the carrier gas and the reactive gas. The base pressure of the reactor was $3 \times 10^{-6}$ torr, achieved by the use of a turbo molecular pump. The commercial (Asahi Glass Co., Ltd.) quartz substrates of dimension 10 mm×10 mm were employed, which were cleaned by successive ultrasonic cleaning in analytically pure ethanol, acetone and ethanol before being introduced into the reactor. Prior to the deposition, the substrate was heated at 400° C. for 60 minutes in vacuum of $3 \times 10^{-6}$ torr for further thermal cleaning. The deposition parameters employed are summarized in Table I. The film thickness was estimated by cross-section scanning electron microscopy with Philips XL30 FEG-SEM and confirmed by Alpha-step 500 surface profiler (at steps generated by scratching off the as-deposited film without hurting the substrate). The type of conductivity was determined by the Hall-effect method as well as the Seebeck technique. The chemical composition in the film was measured by energy dispersive X-ray spectroscopy (EDX) and the valence of Cu was determined by employing the VG ESCLALAB MKII X-ray photoelectron spectroscopy (XPS) of Mg Kα monochromatized source. The transmittance and absorbance of the films were measured by Shimadzu UV-1601 UV-visible spectrophotometer.

The thickness of the PE-MOCVD deposited film was determined to be about 120 nm, and the deposition rate was 2 nm/min. The transmittances of the original sample is in the range 32–45% in the visible range as shown in FIG. 6.

The optical band gaps of the films have been deduced from the absorption measurement. FIG. 7 shows a plot of $(\alpha h\nu)^2$ against hν where α and hν denote absorption coefficient and photon energy respectively. The optical band gaps was determined to be 3.75 eV, for the film. It is known that the band gap increases with the size decrease of nanocrystals due to quantum confinement.

The energy dispersion x-ray spectrometry (EDX), calibrated using samples with known composition, was employed to determine the ratio of copper and aluminium in the samples. It was found that the ratios of Cu to Al were 1.2:1.0 for the as-deposited film. Such a ratio is slightly higher than the original ratio of Cu to Al in the mixed precursors, possibly due to the differences in the vaporisation speeds of $Cu(dpm)_2$ and $Al(dpm)_3$ and the deposition rates of the relevant species. If the atomic ratio of Cu to Al is 1:1, $CuAlO_2$ may be the phase in the film. However, the higher concentration of Cu may indicate the coexistence of $CuAlO_2$, copper oxides and copper. To determine the structure and phases in the film, XRD was employed. Unfortunately, very weak signals from the films were obtained, possibly due to the film thickness, the very small grain sizes or even amorphous state of the film. To find out the valence of copper in the film, XPS spectra were obtained after the sputtering removal of possible surface contamination. The spectrum of $Cu2p_{3/2}$ was sharp and similar to a single peak. The peak position of $Cu2p_{3/2}$ after calibration was 932.8 eV. This peak can be proved to be $Cu^+$ by the position of CuLMM peak whose position was 337.5 eV. It was found that there was about 80% of $Cu^+$ by peak fitting of $Cu2p_{3/2}$. This may suggest that the prominent phase in the film is $CuAlO_2$, but some copper oxides co-exist.

Seebeck voltages at the cold end of all these samples were positive, indicating p-type conductivity. The Hall effect measurement also led to the same conclusion based on the positive sign of the Hall Coefficients. The mobility and carrier concentration were also measured by the Hall effect method at room temperature. Table II lists the room-temperature conductivity, mobility and carrier concentration of the as-deposited film and the annealed films.

Figure 9A:
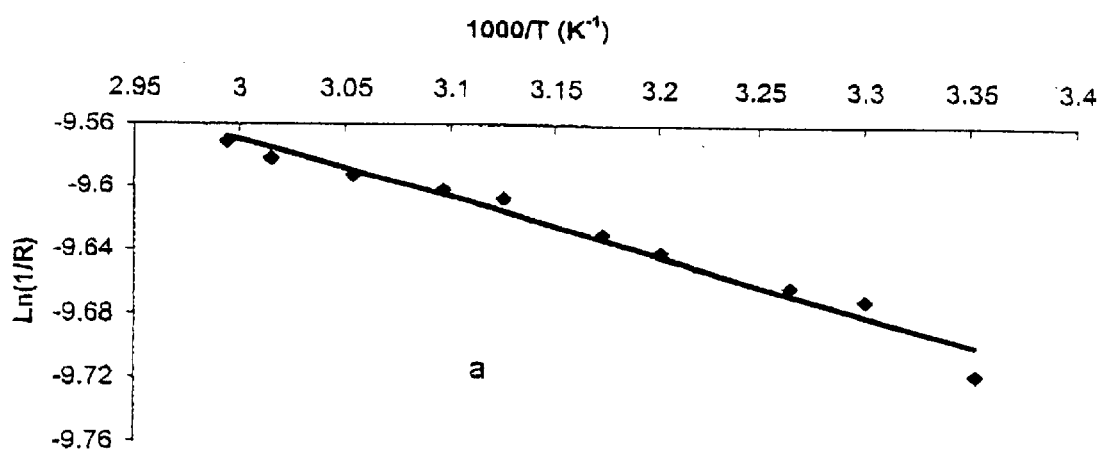

Additional parameters are listed in Table II, such as activation energy of the positive carrier, determined from the temperature dependence of electrical conductivity. The resistance of the film as a function of temperature from RT to 60° C. is shown in FIG. 9a. It is evident that there is a typical semiconductive characteristic of the film. From the curve, the activation energy is estimated to be 30 meV for the film. The activation energy for this sample is smaller than the value of 100 meV–200 meV of Kawazoe et al.

Example 3

Three semiconductor samples prepared as described in Example 2 were annealed in air using a Carbolite furnace RHF1400 at 350° C. for 5 minutes, 10 minutes and 15 minutes, respectively. The obtained films were characterized through UV-Visible spectrophotometry (FIGS. 6 and 7), and through conductance analysis (FIG. 9). After the annealing in air the film became more transparent. The results are found in Table II. FIG. 6 shows that over the visible light range the transmittance of the films is in the range of approximately 32% to 52%. FIG. 7 displays a plot of $(\alpha h\nu)^2$ as a function of hν for the films, from which optical bandgap values of 3.67 eV, 3.64 eV and 3.60 eV were obtained for the samples annealed at 350° C. for 5, 10 and 15 minutes, respectively.

FIG. 9 displays the plot of the electrical conductance as a function of temperature for the films, from which activation energy values ranging from 32 to 77 meV are determined.

It was found that the ratios of Cu to Al were about 1.3:1.0 for the annealed samples, but they are identical to the non-annealed film of Example 2 when considering the experimental error.

It is seen from Table II that the conductivity becomes significantly higher after sample annealing and such a higher conductivity is mainly due to the increase of carrier concentration.

Figure 9B:
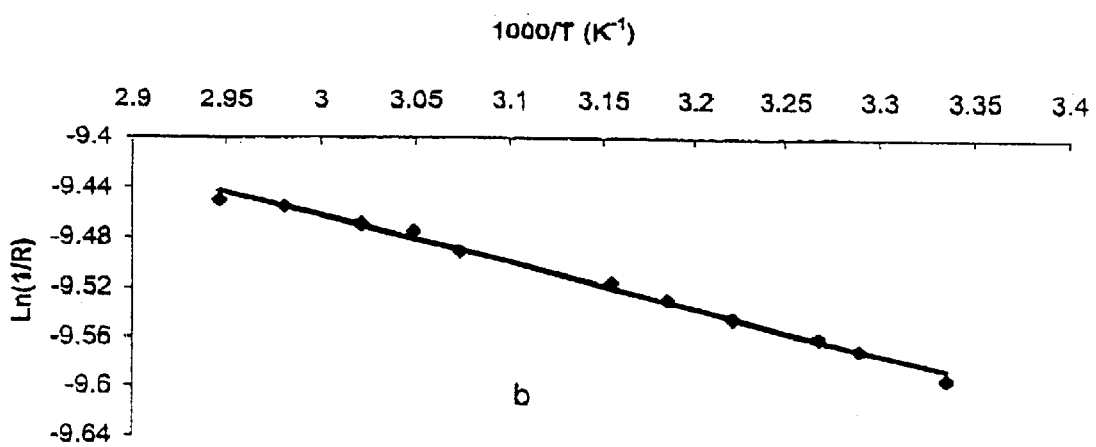
Figure 9C:
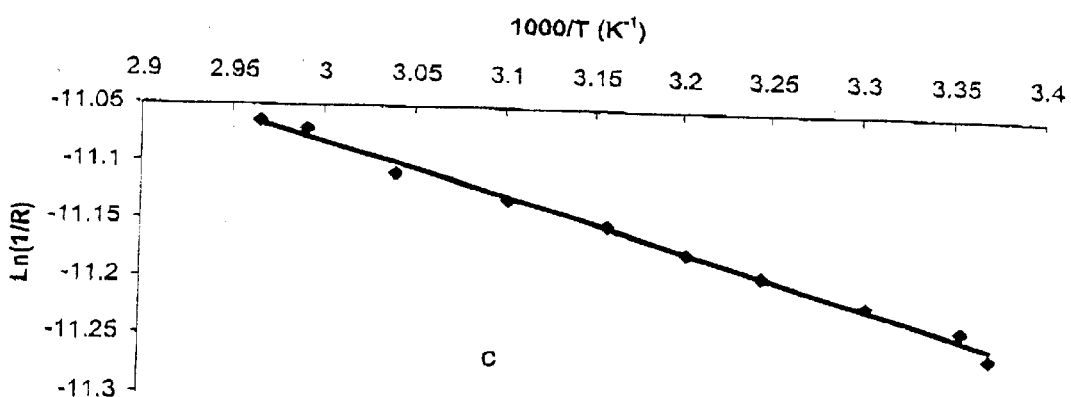
Figure 9D:
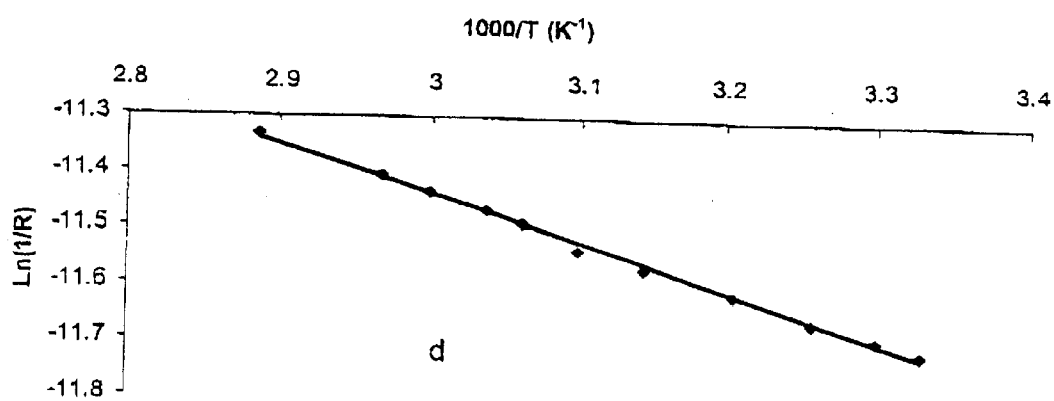

The resistance of the annealed films as a function of temperature from RT to 60° C. is shown in FIGS. 9b–d. It is evident that there is a typical semiconductive characteristic of the films. From the curves, the activation energies are estimated to be 32 meV, 40 meV and 77 meV for the 5 min, 10 min and 15 min annealed samples, respectively. It can be seen that with the increase of annealing time, the activation energy increases. The activation energies for these samples are smaller than the value of 100 mev–200 meV of Kawazoe et al.

TABLE I

CVD Deposition Conditions for the Synthesis of Copper Aluminum Oxide

| | Substrate temperature (° C.) | $O_2$ flow rate (sccm) | RF discharge power (W) | Working pressure (torr) | Carrier gas flow rate (sccm) |
|---|---|---|---|---|---|
| Example 1 | 745 | 25 | 200 | 0.05 | 18 |
| Example 2 | 830 | 30 | 200 | 0.15 | 30 |

TABLE II

Characteristics of p-type Transparent Semiconductors

| | Conductivity (S/cm) | Mobility (cm²/Vs) | Carrier Concentration (× 10¹⁹/cm³) | Visible-Light Transmittance (%) | Activation Energy (meV) | Optical Bandgap (eV) |
|---|---|---|---|---|---|---|
| Chemical Vapor Deposition | | | | | | |
| Example 1 | 2 | 0.16 | 1.8 | ~30–45 | 120 | 3.75 |
| Example 2 | 7.31 | 2.1 | 4.51 | 32–45 | 30 | 3.75 |
| Example 3 (5 min) | 17.08 | 1.96 | 11.67 | 32–52 | 32 | 3.67 |
| Example 3 (10 min) | 16.79 | 1.56 | 16.4 | 32–52 | 40 | 3.64 |
| Example 3 (15 min) | 16.02 | 2.29 | 9.19 | 32–52 | 77 | 3.6 |
| Laser Ablation (comparative example) | 0.095 | 10.4 | 0.013 | 27–52 | 200 | <3.5 |

TABLE III

The lattice spacings (LS) of the product of Example 1, deduced from the rings in the electron diffraction pattern (DP) (see FIG. 2) of the Cu-Al-O film, and the relevant lattice spacings of $CuAlO_2$, $Cu_2O$ and $CuAl_2O_4$

| Ring | LS (nm) From DP | LS (nm)/ plane $CuAlO_2$ | LS (nm)/ plane $Cu_2O$ | LS (nm)/ plane $CuAl_2O_4$ |
|---|---|---|---|---|
| 1 | 0.238 | 0.2375/(012) | — | — |
| 2 | 0.202 | 0.2135/(104) | 0.2140/(200) | — |
| 3 | 0.174 | 0.1730/(107) | — | — |
| 4 | 0.144 | 0.1429/(110) | 0.1420/(300) | 0.1424/(440) |
| 5 | 0.135 | 0.1385/(113) | 0.1350/(310) | 0.1360/(531) |
| 6 | 0.122 | 0.1224/(202) | 0.1230/(222) | 0.1215/(622) |
| 7 | 0.106 | 0.1068/(320) | 0.1070/(NA) | 0.1051/(731) |

What is claimed is:

1. A transparent Cu—Al—O semi-conducting film having a p-type conductivity greater than $0.95 \times 10^{-1}$ S·cm$^{-1}$.

2. The film according to claim 1 having a p-type conductivity of 2.0 S·cm$^{-1}$.

3. The film according to claim 1 having a p-type conductivity of 7.3 S·cm$^{-1}$.

4. The film according to claim 1 having a visible light transmittance higher than 32%.

5. The film according to claim 1 having a conductivity of 2 S·cm$^{-1}$ and a visible light transmittance from 32 to 45%.

6. The film according to claim 1 having a conductivity of 7.5 S·cm$^{-1}$ and a visible light transmittance from 32 to 45%.

7. The film according to claim 1 fabricated by chemical vapor deposition of organo-copper and organo-aluminum precursors.

8. The film according to claim 7, wherein the precursors are copper and aluminum salts comprising ligands of formula I:

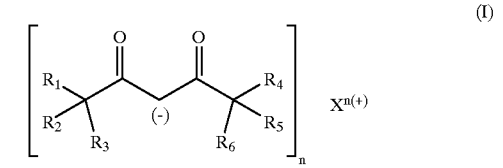

where X is Cu or Al and n is 2 when X is Cu and 3 when X is Al, where $R_1$, $R_2$, $R_3$, $R_4$, $R_5$ and $R_6$ are independently selected from hydrogen, $CH_3$, and fluorine.

9. The film according to claim 7, wherein the organo-copper precursor is selected from the group consisting of $Cu(acac)_2$, $Cu(dpm)_2$, $Cu(tfa)_2$, $Cu(pta)2$ and $Cu(hfa)_2$, and the organo-aluminum precursor is selected from the group consisting of $Al(acac)_3$, $Al(dpm)_3$, $Al(tfa)_3$, $Al(pta)_3$ and $Al(hfa)_3$.

10. The film according to claim 7, wherein the organo-copper precursor is $Cu(acac)_2$, and the organo-aluminum precursor is $Al(acac)_3$.

11. The film according to claim 7, wherein the organo-copper precursor is $Cu(dpm)_2$, and the organo-aluminum precursor is $Al(dpm)_3$.

12. The film according to claim 7 which is further annealed in air.

13. The film of claim 11 which is annealed in air at 350° C. for 5 minutes.

14. The film according to claim 13 having a conductivity of 17 $S \cdot cm^{-1}$ and a visible light transmittance from 32 to 52%.

15. The film according to claim 7, wherein the organo-copper and the organo-aluminum precursors are in a molar ratio of 1:1.

16. The film according to claim 7, wherein the chemical vapor deposition is carried out by plasma-enhanced metal organic chemical vapor deposition.

17. The film according to claim 7, wherein the film is deposited on a transparent quartz substrate.

18. The film according to claim 1 which is nano-structured.

19. The film according to claim 1 which is amorphous.

20. The film according to claim 1 which is polycrystalline.

21. The film according to claim 1 which is single crystalline.

* * * * *

UNITED STATES PATENT AND TRADEMARK OFFICE
CERTIFICATE OF CORRECTION

PATENT NO. : 6,696,700 B2
DATED : February 24, 2004
INVENTOR(S) : Hao Gong et al It is certified that error appears in the above-identified patent and that said Letters Patent is hereby corrected as shown below:

Title page,
Item [54], Title, which reads "...SEMICONDUCTOR" should be
-- ...SEMICONDUCTORS --; and Column 10,
Line 16, which reads "...conductivity greater than $0.95 \times 10^{-1}$ $S \cdot cm^{-1}$." should be
-- ...conductivity of 2.0 $S \cdot cm^{-1}$ or greater. --.

Signed and Sealed this

Thirty-first Day of August, 2004

JON W. DUDAS
*Director of the United States Patent and Trademark Office*